(12) United States Patent
Jami

(10) Patent No.: US 7,509,032 B2
(45) Date of Patent: Mar. 24, 2009

(54) MOTOR DRIVE CONTROL CIRCUIT AND MOTOR APPARATUS USING THE SAME

(75) Inventor: Naoya Jami, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/597,497

(22) PCT Filed: Jan. 27, 2005

(86) PCT No.: PCT/JP2005/001152

§ 371 (c)(1),
(2), (4) Date: Apr. 6, 2007

(87) PCT Pub. No.: WO2005/071827

PCT Pub. Date: Aug. 4, 2005

(65) Prior Publication Data

US 2008/0018295 A1    Jan. 24, 2008

(30) Foreign Application Priority Data

Jan. 27, 2004    (JP) ............................. 2004-019043

(51) Int. Cl.
H02P 6/00 (2006.01)
H02P 6/08 (2006.01)

(52) U.S. Cl. ..................... 388/811; 388/815; 318/811; 318/812; 318/721

(58) Field of Classification Search ......... 388/811–814; 318/811, 812, 721
See application file for complete search history.

(56) References Cited

U.S. PATENT DOCUMENTS 6,188,187 B1 * 2/2001 Harlan .................. 318/400.04
7,304,452 B2 * 12/2007 Nagai et al. .................. 318/811
2008/0018279 A1 * 1/2008 Fukamizu et al. ........... 318/432

FOREIGN PATENT DOCUMENTS

| JP | 10-201280 A | 7/1998 |
| JP | 2001-245486 A | 9/2001 |
| JP | 2002-10681 A | 1/2002 |
| JP | 2003-111481 A | 4/2003 |

OTHER PUBLICATIONS

Official communication issued in the corresponding International Application No. PCT/JP2005/001152, mailed on Apr. 12, 2005.

* cited by examiner

*Primary Examiner*—Walter Benson
*Assistant Examiner*—Eduardo Colon-Santana
(74) *Attorney, Agent, or Firm*—Keating & Bennett, LLP

(57) ABSTRACT

A motor drive control circuit includes a rotation control amplifier that compares the lower of a voltage limiting reference voltage of a reference voltage source and a rotation speed control voltage, which controls the rotation speed of the motor, on a terminal with a peak voltage from an impedance element that detects a drive current of a motor. The motor drive control circuit further includes a rotation limiting comparator that compares a voltage that is substantially equal to the voltage limiting reference voltage with the peak voltage, a synthesis circuit that amplifies rotation position detection signals from the motor according to the output voltage of the rotation control amplifier, a PWM output comparator that compares the outputs of the synthesis circuit with a triangular wave voltage and outputs PWM signals, and a motor-driver control circuit that removes an output period of the rotation limiting comparator from the ON period of each PWM signal and controls a motor driver that drives the motor. The motor drive control circuit operates the elements defining the motor driver more in a safe operation region.

4 Claims, 5 Drawing Sheets

MOTOR DRIVE CONTROL CIRCUIT AND MOTOR APPARATUS USING THE SAME

BACKGROUND OF THE INVENTION

1. Field of the Invention

The present invention relates to a motor drive control circuit of a PWM (Pulse Width Modulation) control technique and also relates to a motor apparatus including such a motor drive control circuit.

2. Description of the Related Art

A motor apparatus using a conventional motor drive control circuit of a PWM control technique is shown in FIG. 4. A motor apparatus 101 shown in the figure includes a motor 102, a motor driver 107 for driving the motor 102, and a motor drive control circuit 106 for controlling the motor driver 107.

The motor 102 includes a rotor 109; coils $L_U$, $L_V$, $L_W$ of the U phase, V phase, and W phase for controlling the rotation of the rotor 109; Hall elements $H_U$, $H_V$, $H_W$ for detecting the position (phase) of the rotor 109; and a rotation speed counter 104 for detecting the rotation speed of the rotor 109. The motor driver 107 includes three output transistors $T_{UU}$, $T_{VU}$, $T_{WU}$ on the power source side and three output transistors $T_{UL}$, $T_{VL}$, $T_{WL}$ on the ground side. The motor drive control circuit 106 includes a current detection resistor 112 for converting a drive current of the motor 102 into a voltage; a peak hold circuit 114 for receiving this voltage and holding the peak voltage within the ON period of the below-described PWM signal; a rotation control amplifier 113 for inputting the peak voltage, the voltage limiting reference voltage of a reference voltage source 123, and a rotation speed control voltage of a signal input terminal SIG, and comparing the lower of the voltage limiting reference voltage and rotation speed control voltage with the peak voltage; a capacitor 122 for oscillation prevention that is connected to the output of the rotation control amplifier 113 and has a capacitance of, for example, about 0.01 μF; a Hall amplifier 116 for inputting the Hall signals of the Hall elements $H_U$, $H_V$, $H_W$ and outputting the amplified signals; a synthesis circuit 117 for inputting the output of the Hall amplifier 116, advancing each input by a constant phase (for example, 30°), conducting amplification at an amplification ratio corresponding to the output voltage of the rotation control amplifier 113, and outputting the amplified signals; a triangular wave generator 119 for generating and outputting a triangular wave; a PWM output comparator 118 for comparing the polarity discrimination signals $U_{HL}$, $V_{HL}$, $W_{HL}$, which are the outputs of the synthesis circuit 117, as shown in FIG. 6, with the triangular wave and outputting PWM signals $U_{PWM}$, $V_{PWM}$, $W_{PWM}$; and a motor-driver control circuit 120 for outputting to the motor driver 107 a control signal based on the PWM signals.

The detection output of the rotation speed counter 104 of the motor 102 is inputted to a motor control command unit (not shown in the figure) including a CPU. The CPU outputs a command signal (rotation speed control voltage) corresponding to the desired motor rotation speed to the signal input terminal SIG of the motor drive control circuit 106. If the detection output of the rotation speed counter 104 is less than the desired motor rotation speed, the CPU increases the rotation speed control voltage so as to obtain the desired motor rotation speed. In such a case, the rotation control amplifier 113 increases the output voltage thereof since the rotation speed control voltage becomes higher than the peak voltage. Therefore, in the synthesis circuit 117, the amplification ratio increases and the amplitude of the polarity discrimination signals $U_{HL}$, $V_{HL}$, $W_{HL}$ increases. Then, the PWM output comparator 118 generates the PWM signals $U_{PWM}$, $V_{PWM}$, $W_{PWM}$ having a duty ratio with a large ON period and outputs to the motor driver 107 the control signals based on PWM signals via the motor-driver control circuit 120. As a result, the drive current that is passed by the motor driver 107 to the coils $L_U$, $L_V$, $L_W$ of the U phase, V phase, W phase of the motor 102 increases and, therefore, the rotation speed of the motor 102 increases. Then, this drive current is converted into a voltage by the current detection resistor 112, and the peak voltage thereof is compared with the rotation speed control voltage of the signal input terminal SIG, as described above. This loop operation is repeated and the peak voltage of the detection voltage is thereby matched with the rotation speed control voltage and stabilized.

Here, when an overload is applied to the motor 102 (referred to below as an abnormality), for example, when paper is jammed in the case where the motor 102 is used as a paper feed actuator of a copier, the detected rotation speed by the rotation speed counter 104 decreases. Therefore, the CPU increases the rotation speed control voltage according to the detected rotation speed in order to increase the rotation speed of the motor 102. However, because the rotation speed of the motor 102 does not increase, this rotation speed control voltage rises too much. If the voltage limiting reference voltage of the reference voltage source 123 is exceeded, the voltage limiting reference voltage becomes lower and is, therefore, compared with the peak voltage. Thus, when the rotation speed control voltage rises too much, the excess increase of the drive current of the motor driver 107 flowing to the coils $L_U$, $L_V$, $L_W$ of the U phase, V phase, W phase of the motor 102 is prevented and damage to the elements is prevented (for example, see Japanese Patent Application Laid-open No. 2003-111481).

As described above, when the rotation speed control voltage from the CPU rises too much and exceeds the voltage limiting reference voltage of the reference voltage source 123, the voltage limiting reference voltage, rather than the rotation speed control voltage, is compared with the peak voltage in the rotation control amplifier 113. However, since the capacitor 122 for oscillation prevention that has a capacitance of about 0.01 μF is connected to the output of the rotation control amplifier 113, the output thereof is delayed, a time is required for the output to be reflected in the synthesis circuit 117, and a time is also required for the output to be reflected in the output of the PWM output comparator 118 and then in the rotation speed of the motor 102, which is the final output.

FIG. 5 shows a voltage waveform detected by the current detection resistor 112 in the case of an abnormality. The voltage E in the figure is a voltage limiting reference voltage of the reference voltage source 123, and below this voltage is a region in which the elements defining the motor driver 107 are not damaged, that is, an element safe operation region. The amplitudes of polarity discrimination signals $U_{HL}$, $V_{HL}$, $W_{HL}$ inputted to the PWM output comparator 118 include an extra amount due to the above-described delay of the output of the rotation control amplifier 113, the PWM signals $U_{PWM}$, $V_{PWM}$, $W_{PWM}$ containing an extra ON time period in the duty ratio are outputted from the PWM comparator 118, and the motor driver 107 passes an extra drive current. Thus, in the conventional motor apparatus, a time period (for example, a time period shown by points A-B in FIG. 5) occurs in which the motor drive 107 operates above the element safe operation region. Furthermore, the power consumed in this period is wasted power.

As a countermeasure, an extra voltage that is due to the delay time caused by the capacitor 122 for oscillation prevention can be estimated and the voltage limiting reference voltage of the reference voltage source 123 can be set accordingly lower. However, because a load at the time of abnormality is not constant, the peak value of the voltage detected by the current detection resistor 112 varies, for example, as voltage C or voltage D shown in FIG. 5. Therefore, this countermeasure is actually difficult to use.

SUMMARY OF THE INVENTION

In order to overcome the problems described above, preferred embodiments of the present invention provide a motor drive control circuit more capable of operating the elements defining the motor driver in a safe operation region.

The motor drive control circuit of a first preferred embodiment of the present invention includes a rotation control amplifier that inputs a peak voltage of a voltage generated in an impedance element for detecting a drive current of a motor, a voltage limiting reference voltage, and a rotation speed control voltage for controlling a rotation speed of the motor and compares the lower of the voltage limiting reference voltage and rotation speed control voltage with the peak voltage; a rotation limiting comparator that inputs and compares a voltage that is substantially equal to the voltage limiting reference voltage with the peak voltage; a synthesis circuit that amplifies a rotation position detection signal of the motor according to the output voltage of the rotation control amplifier; a PWM output comparator that compares an output of the synthesis circuit with a triangular wave voltage of a triangular wave generator and outputs a PWM signal; and a motor-driver control circuit that inputs the PWM signal and an output signal of the rotation limiting comparator, removes an output period of the rotation limiting comparator from an ON period of the PWM signal, and controls a motor driver that drives the motor.

In the motor drive control circuit, the rotation control amplifier, rotation limiting comparator, PWM output comparator, and motor-driver control circuit are preferably integrated on a semiconductor substrate.

A motor apparatus of another preferred embodiment of the present invention includes the above-described motor drive control circuit, a motor driver controlled by the motor drive control circuit, and a motor driven by the motor driver.

The motor drive control circuit of the first preferred embodiment of the present invention and a motor apparatus using such a circuit are provided with a rotation limiting comparator in parallel with a rotation control amplifier. Therefore, the elements defining the motor driver can be operated more in a safe operation region and unnecessary power consumption can be minimized.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
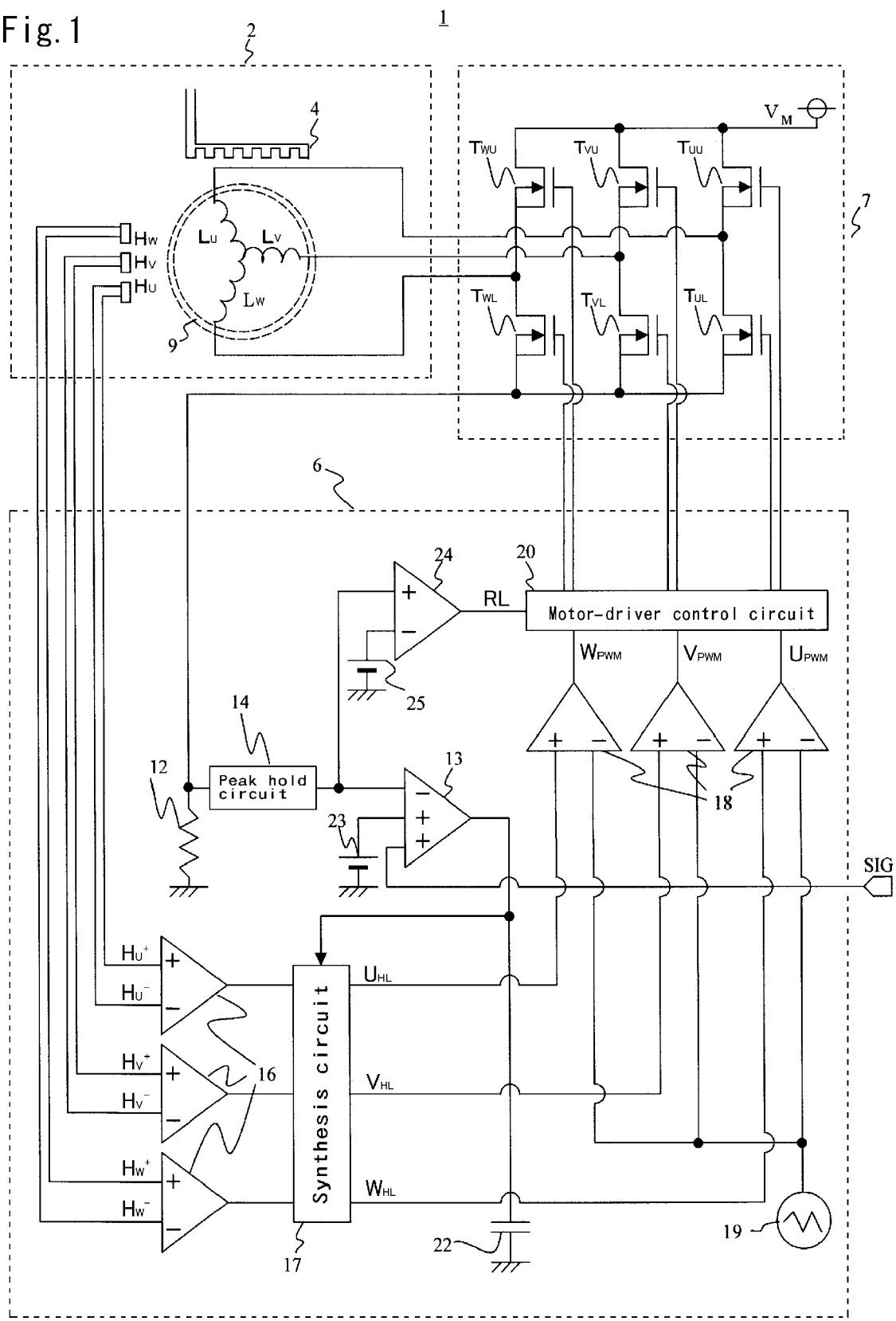
FIG. 1 is a structural drawing of the motor apparatus of a first preferred embodiment of the present invention.

The motor drive control circuit of a PWM control system of a first preferred embodiment for carrying out the present invention and a motor apparatus including such a motor drive control circuit will be explained below with reference to FIG. 1. A motor apparatus 1 shown in FIG. 1 includes a motor 2, a motor driver 7 for driving the motor 2, and a motor drive control circuit 6 for controlling the motor driver 7.

The motor 2 includes a rotor 9 having a permanent magnet; coils $L_U$, $L_V$, $L_W$ of the U phase, V phase, W phase that are Y-type connected to control the rotation of the rotor 9; Hall elements $H_U$, $H_V$, $H_W$ for detecting the position (phase) of the rotor 9 and outputting the rotation position detection signals (Hall signals); and a rotation speed counter 4 for detecting the rotation speed of the motor 2 (rotor 9). The rotation position detection signals (Hall signals) of the Hall elements $H_U$, $H_V$, $H_W$ are differential sine waves $H_U^+$, $H_U^-$, $H_V^+$, $H_V^-$, $H_W^+$, $H_W^-$ in the U phase, V phase, W phase, respectively, and the difference between the phases is 120°. The detection output of the rotation speed counter 4 is inputted to the motor control command unit (not shown in the figure) having a CPU, and the CPU generates a rotation speed control voltage for setting the motor 2 to the desired rotation speed based on the detection output, and outputs this rotation speed control voltage to the signal input terminal SIG of the motor drive control circuit 6.

The motor driver 7 includes three output transistors $T_{UU}$, $T_{VU}$, $T_{WU}$ on the power source side and three output transistors $T_{UL}$, $T_{VL}$, $T_{WL}$ on the ground side; the transistors preferably being N-type MOS transistors. The source of the output transistor $T_{UU}$ on the power source side and the drain of the output transistor $T_{UL}$ on the ground side are connected to the coil $L_U$ of the U phase of the motor 2. The source of the transistor $T_{VU}$ on the power source side and the drain of the output transistor $T_{VL}$ on the ground side are connected to the coil $L_V$ of the V phase of the motor 2, and the source of the transistor $T_{WU}$ on the power source side and the drain of the output transistor $T_{WL}$ on the ground side are connected to the coil $L_W$ of the W phase of the motor 2. The drains of the output transistors $T_{UU}$, $T_{VU}$, $T_{WU}$ on the power source side are connected to the power source $V_M$ for driving the motor, and the sources of the transistors $T_{UL}$, $T_{VL}$, $T_{WL}$ on the ground side are connected to the ground via a current detection resistor 12, which is the below-described impedance element. PWM signal outputs of the below-described motor-driver control circuit 20 are inputted to the gates of those output transistors $T_{UU}$, $T_{VU}$, $T_{WU}$, $T_{UL}$, $T_{VL}$, $T_{WL}$. When a current flows from the coil $L_U$ of the U phase of the motor 2 to the coil $L_V$ of the V phase, the PWM output from the motor-driver control circuit 20 is received and the output transistor $T_{UU}$ on the power source side and the output transistor $T_{VL}$ on the ground side are switched ON. When a current flows from the coil $L_V$ of the V phase to the coil $L_W$ of the W phase, the output transistor $T_{VU}$ on the power source side and the output transistor $T_{WL}$ on the ground side are switched ON. When a current flows from the coil $L_W$ of the W phase to the coil $L_U$ of the U phase, the output transistor $T_{WU}$ on the power source side and the output transistor $T_{UL}$ on the ground side are switched ON. The PWM output of the motor-driver control circuit 20 is thus received, the output transistors on the power source side and the output transistors on the ground side are thus switched, the current quantity supplied to the motor 2 is varied and the rotation speed of the motor 2 is controlled according to the variation of the ON-OFF duty ratio based on the switching operations.

The motor drive control circuit 6 includes a current detection element 12, which is the aforementioned impedance element for converting the drive current of the motor 2 into a voltage; a peak hold circuit 14 for receiving this voltage and holding the peak voltage of the ON period of the PWM signal; a rotation control amplifier 13 that inputs the peak voltage, the voltage limiting reference voltage of the reference voltage source 23, and the rotation speed control voltage of the signal input terminal SIG and compares the lower of the voltage limiting reference voltage and rotation speed control voltage with the peak voltage; a rotation limiting comparator 24 that inputs and compares a voltage of the reference voltage source 25 that is substantially equal to the reference voltage source 23 with the peak voltage; a capacitor 22 for oscillation prevention that is connected to the output of the rotation control amplifier 13; a Hall amplifier 16 for inputting the rotation phase detection signals of the Hall elements $H_U$, $H_V$, $H_W$ and outputting the amplified signals; a synthesis circuit 17 that inputs the outputs of the Hall amplifier, advances each by a constant phase, amplifies according to the voltage of the rotation control amplifier 13, and outputs the polarity discrimination signals $U_{HL}$, $V_{HL}$, $W_{HL}$; a triangular wave generator 19 for generating and outputting a triangular wave; a PWM output comparator 18 for comparing the triangular wave with the polarity discrimination signals $U_{HL}$, $V_{HL}$, $W_{HL}$ and outputting PWM signals $U_{PWM}$, $V_{PWM}$, $W_{PWM}$; and a motor-driver control circuit 20 for outputting a signal for controlling the motor driver 7 from the output signal of the rotation limiting comparator 24 and PWM signals $U_{PWM}$, $V_{PWM}$, $W_{PWM}$ of the PWM output comparator 18.

In the current detection resistor 12, a drive current flows in the ON period of the PWM signal, and no drive current flows in the OFF period of the PWM signal because each transistor of the motor driver 7 is switched off. In the current detection resistor 12, all the drive currents flow in the ON periods of the U phase, V phase, W phase, and the currents change depending on the respective phase. In the peak hold circuit 14, the peak voltage of the voltage detected by the current detection resistor 12 in the ON period of the PWM signal is held within the OFF period of the PWM signal, but the voltage is gradually discharged and drops with a fixed time constant.

The rotation control amplifier 13 has one inversion input terminal and two non-inversion input terminals. The peak voltage of the peak hold circuit 14 is inputted to the inversion input terminal, the voltage limiting reference voltage of the reference voltage source 23 and the rotation speed control voltage of the signal input terminal SIG are inputted to two non-inversion input terminals, and as described above, the lower of the voltage limiting reference voltage and rotation speed control voltage is compared with the peak voltage. The capacitor 22 for oscillation prevention, which is connected to the output of the rotation control amplifier 13, performs phase compensation to prevent oscillations in a loop composed of the rotation control amplifier 13, synthesis circuit 17, PWM output comparator 18, motor-driver control circuit 20, motor driver 7, current detection resistor 12, and peak hold circuit 14. The capacitance of the capacitor is, for example, 0.01 µF.

In the rotation limiting comparator 24, the peak voltage of the peak hold circuit 14 is inputted to a non-inversion input terminal, and the voltage of the reference voltage source 25 that is substantially equal to the reference voltage source 23 is inputted to the inversion input terminal. A unique feature herein is that a capacitor with a high capacitance, such as the capacitor 22 connected to the output of the rotation control amplifier 13, is not connected to the output of the rotation limiting comparator 24, and that the output thereof is inputted directly to the motor-driver control circuit 20. Thus, the output of the rotation limiting comparator 24 is used to remove the extra ON period of the PWM signal created by the delay caused by the capacitor 22 for oscillation prevention in the motor-driver control circuit 20 at the time of abnormality (when an overload is applied to the motor 2), as described below. Therefore, the voltage of the reference voltage source 25 is not required to be absolutely identical to the voltage of the reference voltage source 23, if the desired operation of the motor-driver control circuit 20 is to be achieved.

The Hall amplifier 16 includes a differential amplifier for the U phase that receives the rotation phase detection signals (Hall signals) $H_U^+$, $H_U^-$ of the Hall element $H_U$ at the non-inversion input terminal and inversion input terminal, respectively; a differential amplifier for the V phase that receives the rotation phase detection signals $H_V^+$, $H_V^-$ of the Hall element $H_V$ at the non-inversion side input terminal and inversion input terminal, respectively; and a differential amplifier for the W phase that receives the rotation phase detection signals $H_W^+$, $H_W^-$ of the Hall element $H_W$ at the non-inversion input terminal and inversion input terminal, respectively. Those differential amplifiers amplify the differential voltages of respective rotation position detection signals at a constant amplification ratio and output the amplified voltages.

The synthesis circuit 17 inputs the rotation position detection signal outputs of the differential amplifiers for the U phase, V phase, W phase of the Hall amplifier 16, amplifies them according to the output voltage of the rotation control amplifier 13, and outputs the polarity discrimination signals $U_{HL}$, $V_{HL}$, $W_{HL}$. The adjustment of the amplification ratio is performed by regulating the current source of the differential amplifier (not shown in the figure) in the synthesis circuit 17 with the output voltage of the rotation control amplifier 13. Each input signal is advanced by a fixed phase (for example, about 30°) to apply a magnetic field at a timing that makes it possible to rotate the rotor 9 of the motor 2 with the highest efficiency.

The PWM output comparator 18 includes a comparator for the U phase that inputs the triangular wave of the triangular wave generator 19 to an inversion input terminal, inputs the polarity discrimination signal $U_{HL}$ of the U phase of the synthesis circuit 17 to the non-inversion input terminal, and compares the two; a comparator for the V phase that inputs the triangular wave to an inversion input terminal, inputs the polarity discrimination signal $V_{HL}$ of the V phase to the non-inversion input terminal, and compares the two; and a comparator for the W phase that inputs the triangular wave to an inversion input terminal, inputs the polarity discrimination signal $W_{HL}$ Of the W phase to the non-inversion input terminal, and compares the two. Therefore, PWM signals $U_{PWM}$, $V_{PWM}$, $W_{PWM}$ for which a period with a voltage that is higher than the triangular wave serves as a high-level ON period are outputted with respect to the polarity discrimination signals $U_{HL}$, $V_{HL}$, $W_{HL}$ of the respective U phase, V phase, W phase that have a phase difference of 120°.

Figure 2:
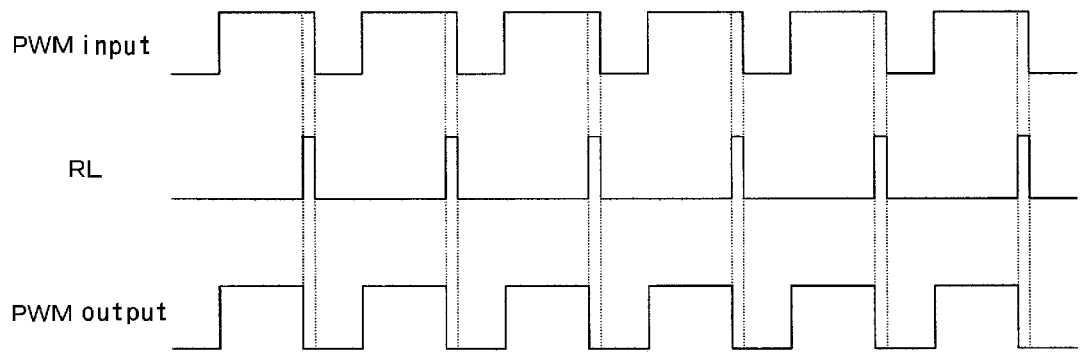
FIG. 2 is an operation waveform diagram of the motor-driver control circuit of the first preferred embodiment of the present invention.

The motor-driver control circuit 20 inputs the PWM signals (PWM input) ($U_{PWM}$, $V_{PWM}$, $W_{PWM}$) of the PWM output comparator 18 and, as described above, outputs the PWM signals for controlling the switching of the output transistors on the power source side and output transistors on the ground side of the motor driver 7. Furthermore, the motor-driver control circuit 20 inputs the output signal (RL) of the rotation limiting comparator 24, subtracts the pulsing output period of the rotation limiting comparator 24 from the ON period of the PWM signal in order to remove the extra ON period of the PWM signal that is due to the delay caused by the capacitor 22 for oscillation prevention in the case of abnormality, as shown by the waveform in FIG. 2, and outputs the signal (PWM output). When no abnormality has occurred, the rotation limiting comparator 24 produces no pulsing output and, therefore, the PWM signal with unchanged ON period is outputted to the motor driver 7.

The operation performed in the case where the rotation speed of the motor 2 is varied will be explained below. When the rotation speed of the motor 2 is increased, the rotation speed control voltage inputted from the CPU to the signal input terminal SIG is increased. Then, in the rotation control amplifier 13, the rotation speed control voltage becomes higher than the peak voltage of the peak hold circuit 14. Therefore, the output voltage thereof rises. Then, the amplitude of the polarity discrimination signals $U_{HL}$, $V_{HL}$, $W_{HL}$ outputted from the synthesis circuit 17 increases, and PWM signals each having a duty ratio with a large ON period are generated in the PWM output comparator 18 and outputted via the motor-driver control circuit 20 to the motor driver 7. As a result, the drive current of the motor driver 7 flowing to the coils $L_U$, $L_V$, $L_W$ of the U phase, V phase, W phase of the motor 2 increases and, therefore, the rotation speed of the motor 2 increases. This drive current is converted into a voltage by the current detection resistor 12, and the peak voltage thereof is compared with the rotation speed control voltage. The loop of such operations is repeated. As a result, the peak voltage is matched with the rotation speed control voltage and stabilized.

Conversely, when the rotation speed of the motor 2 is decreased, the rotation speed control voltage inputted from the CPU to the signal input terminal SIG is decreased. As a result, the operation of the rotation control amplifier 13, synthesis circuit 17, and PWM output comparator 18 is inverted with respect to that performed when the rotation speed of the motor 2 is increased. As a result, the drive current of the motor driver 7 flowing to the coils $L_U$, $L_V$, $L_W$ of the U phase, V phase, W phase of the motor 2 decreases and, therefore, the rotation speed of the motor 2 decreases. The loop that is identical to the above-described loop is repeated and, as a result, the peak voltage is matched with the rotation speed control voltage and stabilized.

In the case of abnormality (when an overload is applied to the motor 2), the rotation speed detected by the rotation speed counter 4 decreases. Therefore, in order to increase the rotation speed of the motor 2, the CPU increases the rotation speed control voltage outputted to the signal input terminal SIG of the motor drive control circuit 6. However, because the rotation speed of the motor 2 does not increase, this rotation speed control voltage becomes too high. When the rotation speed control voltage exceeds the voltage limiting reference voltage of the reference voltage source 23 in the rotation control amplifier 13, this voltage limiting reference voltage, rather than the rotation speed control voltage, is compared with the peak voltage. The comparison result of the voltage limiting reference voltage with the peak voltage of the peak hold circuit 14 is outputted from the rotation control amplifier 13 and reflected in the output of the synthesis circuit 17, then the output of the PWM output comparator 18, and then the rotation speed of the motor 2, which is the final output. Thus, when the rotation speed control voltage becomes too high, the drive current of the motor driver 7 flowing to the coils $L_U$, $L_V$, $L_W$ of the U phase, V phase, W phase of the motor 2 is prevented from increasing too much and the elements are prevented from being damaged.

Parallel to the operation of the rotation control amplifier 13, in the rotation limiting comparator 24, when the rotation speed control voltage rises too much and the peak voltage of the peak hold circuit 14 follows this rise and exceeds the voltage of the reference voltage source 25, the output thereof is changed to a high level and inputted to the motor-driver control circuit 20. On the other hand, due to the delay of the output signal of the rotation control amplifier 13 connected to the capacitor 22 for oscillation prevention, the amplitudes of the polarity discrimination signals $U_{HL}$, $V_{HL}$, $W_{HL}$ inputted to the PWM output comparator 18 include extra quantities and PWM signals each containing an extra ON period in the duty ratio are outputted from the PWM output comparator 18 to the motor-driver control circuit 20. In the motor-driver control circuit 20, the extra ON period of the PWM signal is removed by subtracting the output period (high-level period) of the rotation limiting comparator 24 from the ON period of the PWM signal, as shown by a waveform diagram in FIG. 2. Further, when the PWM signal becomes OFF, the peak voltage of the peak hold circuit 14 drops via the motor driver 7 and current detection resistor 12 and, therefore, the output of the rotation limiting comparator 24 returns to a low level.

Figure 3:
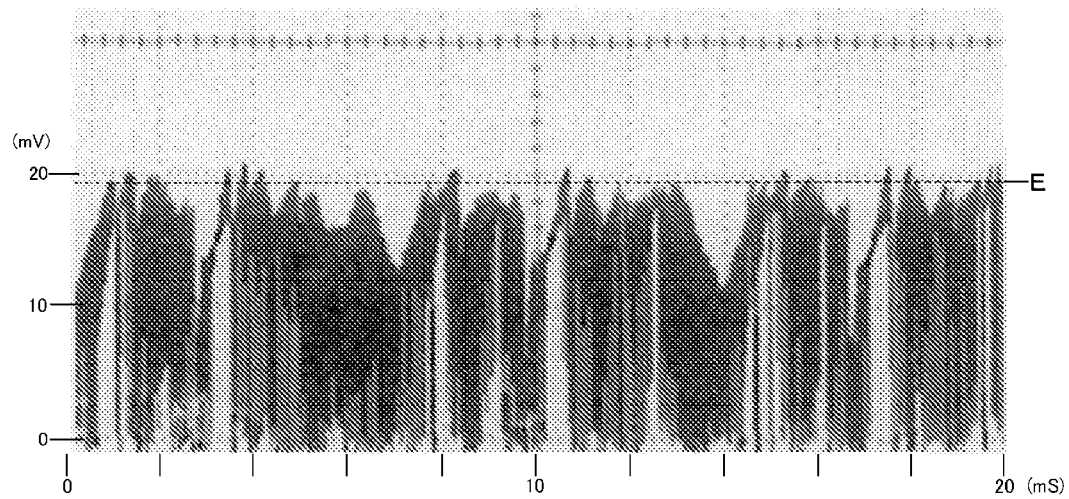
FIG. 3 is a waveform diagram of the voltage detected by the current detection resistor of the first preferred embodiment of the present invention.
Figure 4:
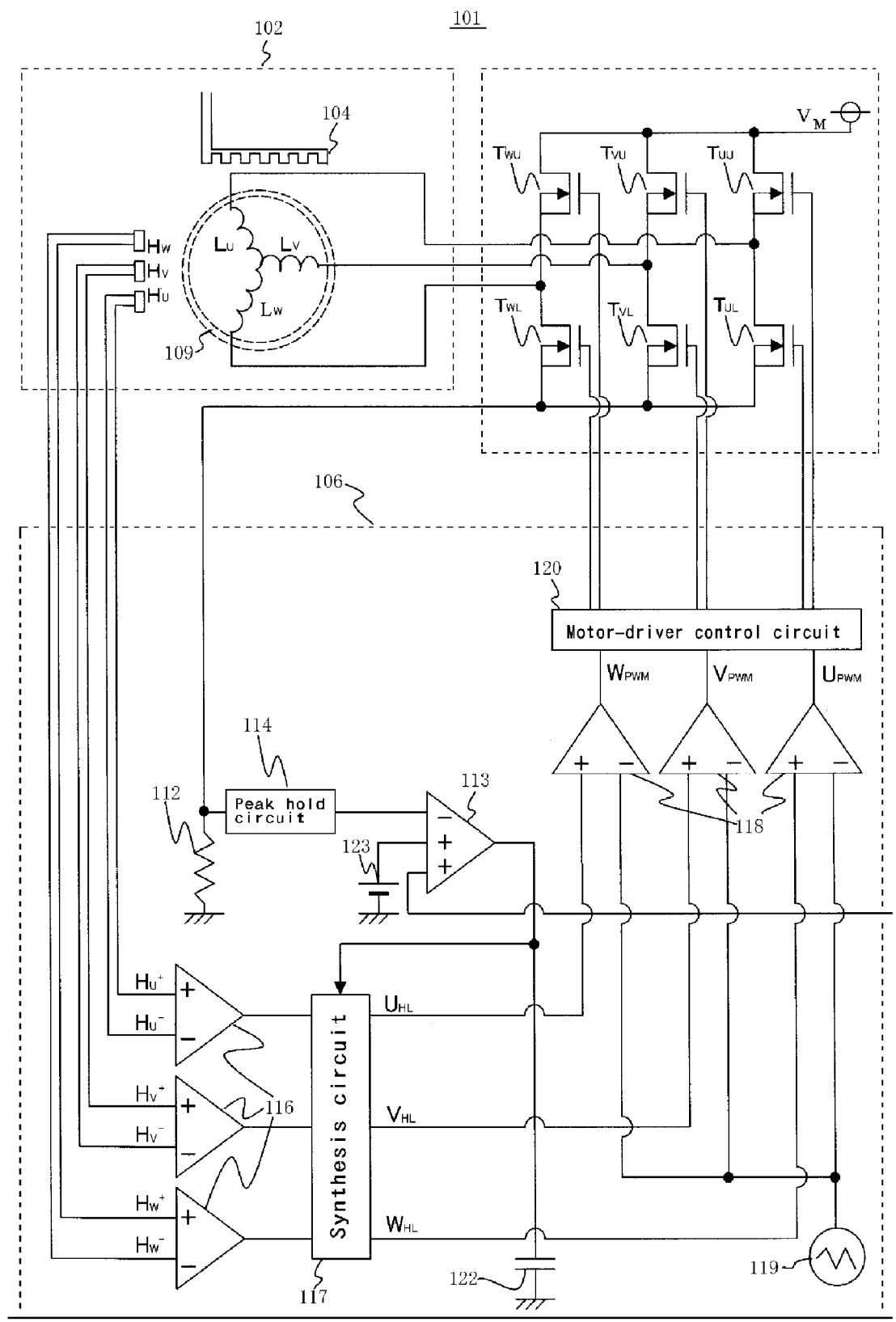
FIG. 4 is a structural drawing of a conventional motor apparatus.
Figure 5:
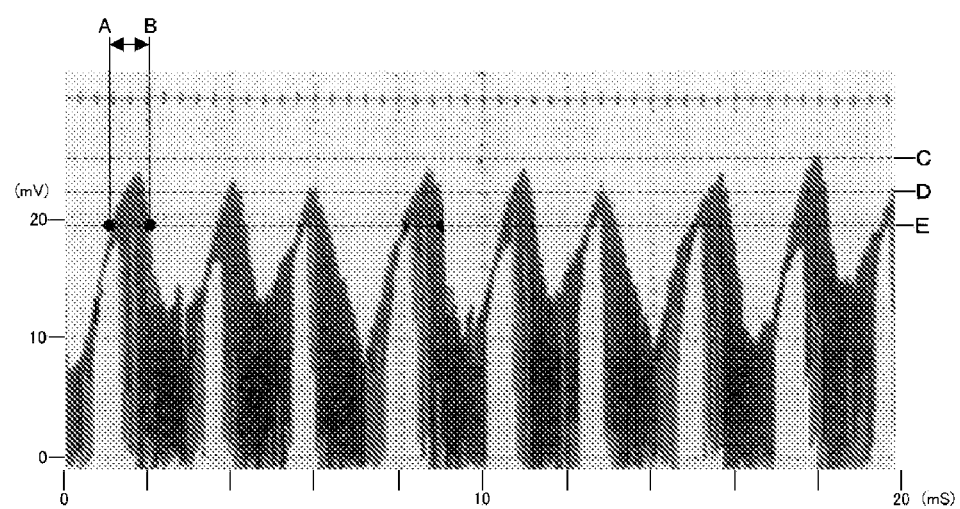
FIG. 5 is a waveform diagram of the voltage detected by the current detection resistor in the conventional motor apparatus.
Figure 6:
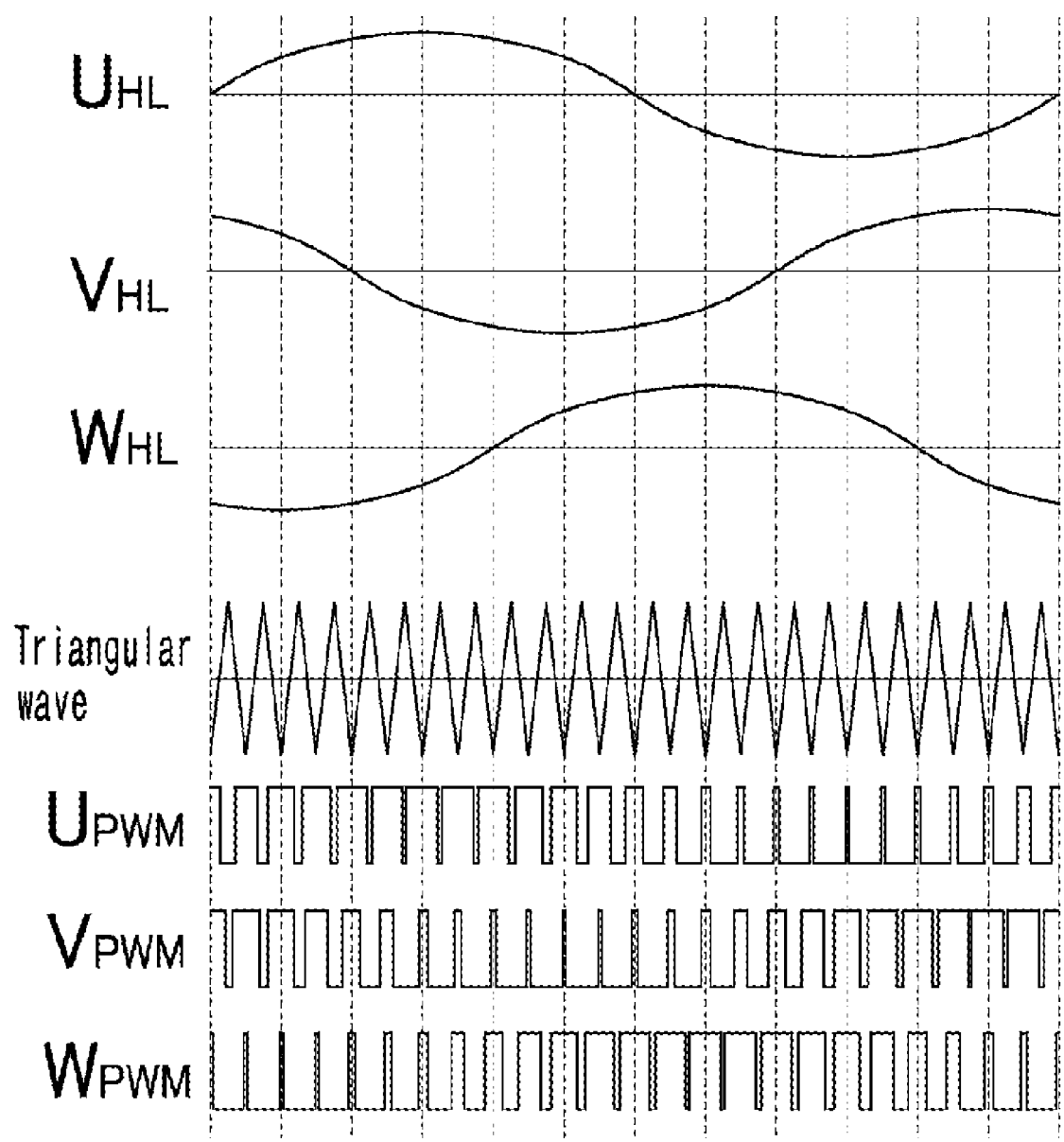
FIG. 6 is a waveform diagram of the input and output of the PWM output comparator.

FIG. 3 shows a voltage waveform during abnormality of the motor apparatus 1 that is detected with the current detection resistor 12. The voltage E in the figure is a voltage limiting reference voltage of the reference voltage source 23. Below this voltage is a region in which the elements defining the motor driver 7 are not damaged, that is, the element safe operation region. The detection voltage of the current detection element 12 is almost below the voltage E, and a period in which the detection voltage greatly exceeds the voltage E, as the above-described period shown by points A-B of the voltage waveform in FIG. 5, is absent.

As described above, because the motor apparatus 1 includes a rotation limiting comparator 24 in parallel with the rotation control amplifier 13 in the motor drive control circuit 6, the extra drive current caused by the delay of the output of the rotation control amplifier 13 can be minimized and the elements defining the motor driver 7 can be operated more in a safe operation region. Furthermore, the motor apparatus 1 can be miniaturized by integrating at least the rotation control amplifier 13, rotation limiting comparator 24, synthesis circuit 17, PWM output comparator 18, and motor-driver control circuit 20 of the motor drive control circuit 6 on a semiconductor substrate, thereby producing one semiconductor device.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A motor drive control circuit comprising:
    a rotation control amplifier arranged to input a peak voltage of a voltage generated in an impedance element to detect a drive current of a motor, a voltage limiting reference voltage, and a rotation speed control voltage arranged to control a rotation speed of the motor and compare the lower of the voltage limiting reference voltage and rotation speed control voltage with the peak voltage;
    a rotation limiting comparator arranged to input and compare a voltage that is substantially equal to said voltage limiting reference voltage with said peak voltage;

a synthesis circuit arranged to amplify a rotation position detection signal of the motor according to an output voltage of the rotation control amplifier;

a PWM output comparator arranged to compare an output of the synthesis circuit with a triangular wave voltage of a triangular wave generator and outputs a PWM signal; and a motor-driver control circuit arranged to input the PWM signal and an output signal of the rotation limiting comparator, remove an output period of the rotation limiting comparator from an ON period of the PWM signal, and control a motor driver that drives the motor.

2. The motor drive control circuit according to claim 1, wherein the rotation control amplifier, the rotation limiting comparator, the PWM output comparator, and the motor-driver control circuit are integrated on a semiconductor substrate.

3. A motor apparatus comprising:
the motor drive control circuit according to claim 2;
a motor driver controlled by the motor drive control circuit; and
a motor driven by the motor driver.

4. A motor apparatus comprising:
the motor drive control circuit according to claim 1;
a motor driver controlled by the motor drive control circuit; and
a motor driven by the motor driver.

* * * * *